(12) United States Patent
Kim

(10) Patent No.: US 9,466,944 B2
(45) Date of Patent: Oct. 11, 2016

(54) COMPACT TUNABLE LASER DEVICE

(71) Applicant: PHOVEL.CO.LTD., Daejeon (KR)

(72) Inventor: Jeong-Soo Kim, Gongju-si (KR)

(73) Assignee: PHOVEL. CO. LTD., Yuseong-gu, Daejeon (KR)

( * ) Notice: Subject to any disclaimer, the term of this patent is extended or adjusted under 35 U.S.C. 154(b) by 0 days.

(21) Appl. No.: 14/399,674

(22) PCT Filed: Mar. 25, 2014

(86) PCT No.: PCT/KR2014/002501
§ 371 (c)(1),
(2) Date: Dec. 2, 2014

(87) PCT Pub. No.: WO2014/157916
PCT Pub. Date: Oct. 2, 2014

(65) Prior Publication Data
US 2016/0006211 A1    Jan. 7, 2016

(30) Foreign Application Priority Data

Mar. 26, 2013   (KR) .................. 10-2013-0031868

(51) Int. Cl.
*H01S 3/10* (2006.01)
*H01S 5/06* (2006.01)
(Continued)

(52) U.S. Cl.
CPC ........ *H01S 5/0612* (2013.01); *H01L 21/31116* (2013.01); *H01L 21/76898* (2013.01);
(Continued)

(58) Field of Classification Search
CPC .... H01S 5/0612; H01S 5/141; H01S 5/0683; H01L 21/76898; H01L 21/31116
See application file for complete search history.

(56) References Cited

U.S. PATENT DOCUMENTS

2002/0031307 A1    3/2002  Kimura
2002/0159683 A1   10/2002  Helin et al.
(Continued)

FOREIGN PATENT DOCUMENTS

KR       10-0859713 B1    9/2008
KR        100859713 B1    9/2008
(Continued)

OTHER PUBLICATIONS

International Search Report Corresponding to PCT/KR2014/002501 mailed Jun. 25, 2014.
(Continued)

*Primary Examiner* — Yuanda Zhang
(74) *Attorney, Agent, or Firm* — Davis & Bujold PLLC; Michael J. Bujold

(57) ABSTRACT

The present invention relates to a compact tunable laser device that can change the oscillation laser wavelength. The laser device includes: a laser diode chip 100 that emits laser light; an optical feedback-partial reflective mirror 500 that feeds some of light emitted from the laser diode chip 100 back to the laser diode chip 100 by reflecting it; a collimating lens 300 that is disposed in a light path between the laser diode chip 100 and the optical feedback-partial reflective mirror 500 and collimates light emitted from the laser diode chip 100; a tunable-selective filter 300 of which the transmissive wavelength changes in accordance with temperature; and a 45°-reflective mirror 400 that changes laser light traveling horizontally to a package bottom into laser light traveling perpendicular to the package bottom, wherein the laser diode chip 100 or the tunable-selective filter 300 is disposed on a thermoelectric element 900 and has an oscillation wavelength changing in accordance with a change in temperature of the thermoelectric element 900.

2 Claims, 9 Drawing Sheets

(51) Int. Cl.
*H01S 5/024* (2006.01)
*H01S 5/14* (2006.01)
*H01L 21/311* (2006.01)
*H01L 21/768* (2006.01)
*H01S 5/0683* (2006.01)
*H01S 3/081* (2006.01)
*H01S 5/022* (2006.01)
*H01S 5/0687* (2006.01)

(52) U.S. Cl.
CPC ........... *H01S5/02415* (2013.01); *H01S 5/141* (2013.01); *H01S 3/0815* (2013.01); *H01S 5/02212* (2013.01); *H01S 5/02248* (2013.01); *H01S 5/0683* (2013.01); *H01S 5/0687* (2013.01)

(56) References Cited

U.S. PATENT DOCUMENTS

2003/0086355 A1   5/2003   Nogami
2005/0047719 A1*  3/2005   Srivastava ............. H01S 3/025 385/39
2009/0252188 A1* 10/2009   Rossi .................... H01S 5/141 372/34
2010/0226655 A1*  9/2010   Kim ................... G02B 6/4246 398/139

FOREIGN PATENT DOCUMENTS

| KR | 10-1124171 | B1 | 3/2012 |
| KR | 10-1124173 | B1 | 3/2012 |
| KR | 101124171  | B1 | 3/2012 |
| KR | 101124173  | B1 | 3/2012 |

OTHER PUBLICATIONS

International Search Report issued in the corresponding PCT Application No. PCT/KR2014/002501 mailed Jun. 25, 2014.
Korean Office Action issued in corresponding Korean Application No. 10-2013-0031868 mailed Mar. 21, 2014.

* cited by examiner

COMPACT TUNABLE LASER DEVICE

CROSS-REFERENCE TO RELATED APPLICATION(S)

This application claims the benefit under 35 U.S.C. §119 (a) of International Patent Application No. PCT/KR2014/002501, filed on Mar. 25, 2014, the entire disclosure of which is incorporated herein by reference for all purposes.

TECHNICAL FIELD

The present invention relates to a laser device, particularly a compact tunable laser device that can change an oscillating laser wavelength.

BACKGROUND ART

Recently, communication services with large communication capacity, including video service for smartphones, have been provided. Accordingly, there is a need for greatly increasing the existing communication capacity and a DWDM (Dense Wavelength Division Multiplexing) type communication has been adopted to increase communication capacity using optical fibers that were installed already. The DWDM type communication simultaneously transmits light having several wavelengths through one optical fiber, using a phenomenon that light signals having several wavelengths do not interfere with each other even if they are simultaneously transmitted through one optical fiber, because lasers having different wavelengths do not interfere with each other.

At present, NG-PON2 (Next Generation—Passive Optical Network version 2) is internationally under consideration as a standard and a tunable laser capable of having four channels with a frequency separation of 100 GHz was selected, as an optical communication standard to be installed for subscribers, for NG-PON2. As an optical module for subscribers for NG-PON2, an SEP (Small Form factor Pluggable) transceiver module is the standard and the SFP module package is small in volume, so it is required to reduce the size of the 4-channel tunable laser module.

At present, various types of tunable lasers are on the market, but most of them have an optical device with a large volume in the type of a butterfly packet, so the optical device having a large volume cannot he mounted in the SFP transceiver module. A TO (transistor outline) type package is an optical package that can be mounted in the SFP transceiver, but a tunable TO type optical device that can be tuned in a TO type has not been proposed yet.

DISCLOSURE

Technical Problem

A laser device according to the present invention for achieving the object includes: a laser diode chip that emits laser light; an optical feedback-partial reflective mirror that feeds some of light emitted from the laser diode chip back to the laser diode chip 100 by reflecting it; a collimating lens that is disposed in a light path between the laser diode chip and the optical feedback-partial reflective mirror and collimates light emitted from the laser diode chip; a tunable-selective filter of which the transmissive wavelength changes in accordance with temperature; and a 45°-reflective mirror that changes laser light traveling horizontally to a package bottom into laser light traveling perpendicular to the package bottom, in which the laser diode chip or the tunable-selective filter is disposed on a thermoelectric element and has an oscillation wavelength changing in accordance with a change in temperature of the thermoelectric element.

It is preferable that the optical feedback-partial reflective mirror is disposed over the 45°-reflective mirror.

Further, it is preferable that the 45°-reflective mirror is a partial reflective mirror having a partial reflection/partial transmission characteristic and an optical supervisory photodiode that receives laser light emitted from the laser diode chip and passing through the 45°-reflective mirror and monitors the intensity of the laser light is further disposed at a side of the 45°-reflective mirror.

It is preferable that the laser diode chip, the collimating lens, the tunable-selective filter, the 45°-reflective mirror, and the optical feedback-partial reflective mirror are fixed over the thermoelectric element and disposed in a TO (transistor outline) type package.

It is preferable that reflectivity of the 45°-reflective mirror is 80% to 98% and reflective of the optical feedback-partial reflective mirror is 30% to 80%.

Further, the tunable-selective filter is given a characteristic of effectively transmitting light only at a predetermined specific wavelength and reflecting light at the other wavelengths by a composite semiconductor of $Ga(x1)Al(1-x1)As/Ga(x2)Al(1-x2)As$, on a GaAs substrate. The wavelength half amplitude band of transmitting light is preferably 10 nm or less and more preferably 3 nm or less. It is preferable that the component of Ga is about 1 to 0.6 in $Ga(x)Al(1-x)As$. More preferably, it is preferable that it is manufactured by stacking a GaAs/GaAlAs layer on a GaAs substrate.

It is preferable that the inside of a package housing in which the laser diode chip, the collimating lens, the tunable-selective filter, the 45°-reflective mirror, and the optical feedback-partial reflective mirror are disposed keeps vacuum at 0.2 atmospheric pressure or less.

The preset invention has been proposed to solve the problems in the related art and an object of the present invention is to provide a compact tunable external resonator-type laser device that can be manufactured in the shape of a TO (Transistor Outline) type package that is very small and manufactured at a low cost.

In particular, an object of the present invention is to provide a compact tunable laser device that can be manufacture in a size capable of being mounted on an SFP transceiver case standardized in the related art, by using an inexpensive TO type package and disposing a laser diode package so that the TO type package can be manufactured smaller than a butterfly type package of the related art.

The tunable-selective filter is manufactured by alternately depositing GaAs/GaAIAs layers on a GaAs semiconductor substrate and temperature dependency of the transmission wavelength of the tunable-selective filter is about 90 pm/° C. The type of laser proposed in the present invention is determined in a Fabry-Perot mode in which its oscillation wavelength is determined by a resonator composed of a semiconductor laser diode chip and a partial reflective mirror within a wavelength range passing through the tunable-selective filter. In the present invention, since the semiconductor laser diode chip and the tunable-selective filter based on GaAs are disposed on the thermoelectric element, when the temperature of the thermoelectric element is changed, the temperature of the semiconductor laser diode chip and the tunable-selective filter which are disposed in the resonator is changed. When the temperature of the semiconductor laser diode chip and the tunable-selective filter made of a semiconductor material based on GaAs is changed, reflectivity of the semiconductor laser diode chip and the tunable-selective filter, so that the oscillation wavelength is changed, and accordingly, it is possible to make a tunable-selective laser simply and at a low cost.

Further, according to the present invention, the resonator composed of a laser diode chip and a feedback reflective mirror is manufactured in a folder type and the optical feedback-partial reflective mirror is disposed over the 45°-reflective mirror, so that laser light emitted horizontally from the laser diode chip is chanted into vertical direction. Accordingly, the path of light is adjusted to be suitable for a TO type package having a through-hole through which laser light comes out is formed at a vertical side of the TO type package, so an inexpensive TO type package can be used. Therefore, the manufacturing cost is lower than the laser package of the related art which uses an expensive butterfly type package.

In addition, in the present invention, since the laser diode chip and the optical feedback-partial reflective mirror are manufactured in a folder type and the optical feedback-partial reflective mirror is disposed over the 45°-reflective mirror, it is possible to minimize the area of the bottom of the resonator. Accordingly, it is possible to mount the resonator on a compact TO package having a diameter of 7 mm or less by minimizing the area of the bottom, so that it is possible to manufacture an SFP transceiver using a TO package.

BEST MODE

Preferred embodiments not limiting the present invention will be described hereafter in detail with reference to the accompanying drawings.

Figure 1:
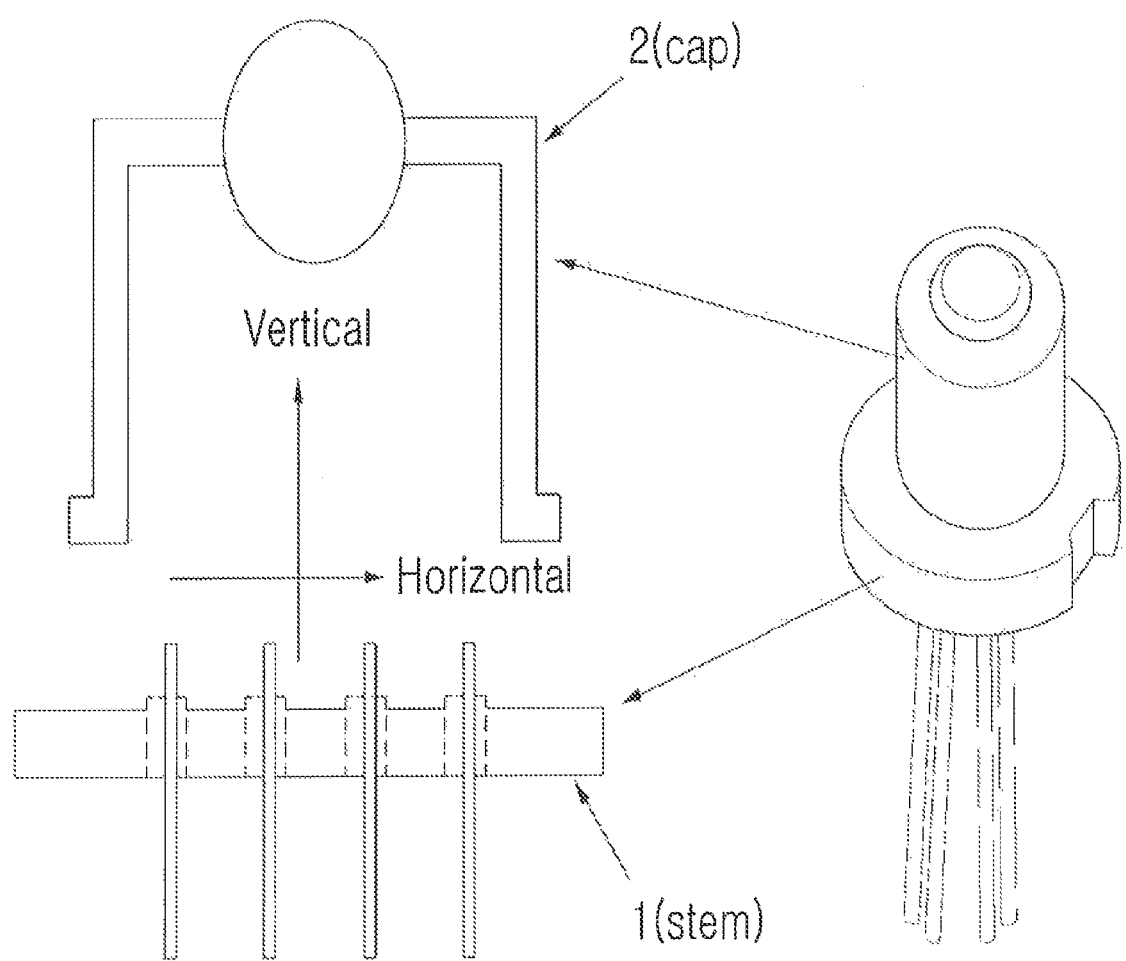
FIG. 1 is a diagram schematically illustrating the external form of a TO type package.

FIG. 1 is a diagram schematically illustrating a TO type package that is applied to the present invention.

As illustrated in FIG. 1, the TO type package includes a stem 1 and a cap 2, in which parts are disposed on the bottom of the stem 1 and sealed by the cap 2. In this structure, laser light is discharged out of the TO type package through a through-hole formed through the top of the cap 2. In general, the through-hole of the cap 2 has a lens or is sealed a flat glass. In FIG. 1, a vertical direction and a horizontal direction to be used for describing the present invention are defined by arrows.

Figure 2:
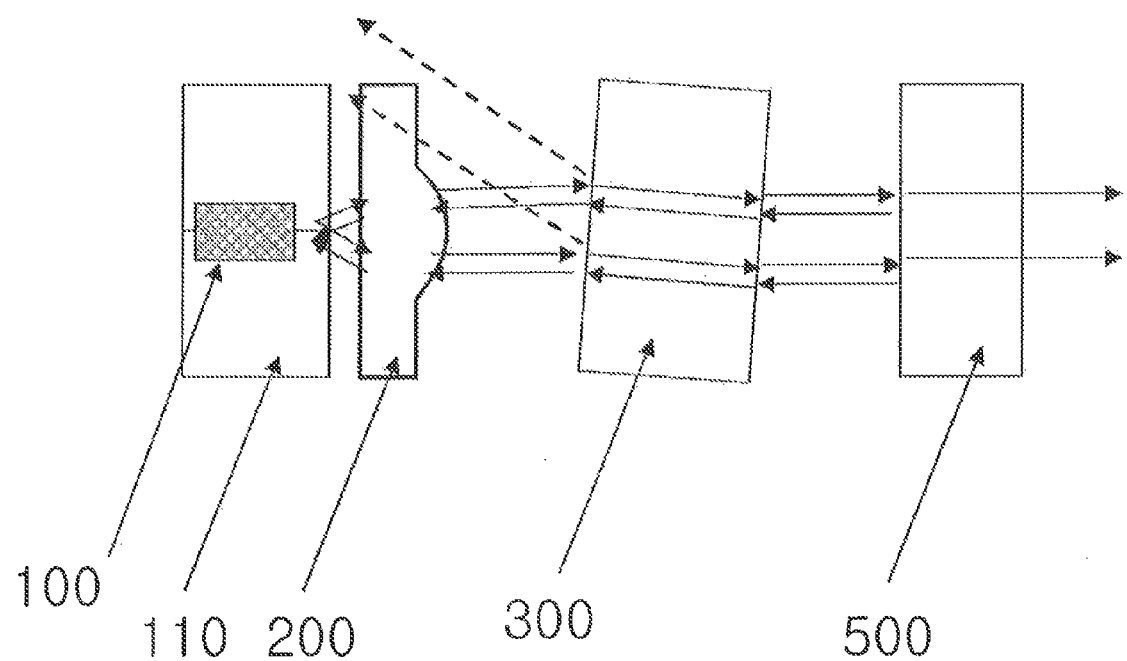
FIG. 2 is a conceptual diagram illustrating the operation principle of an extension resonator-type laser diode package according to the present invention.

FIG. 2 is a conceptual diagram illustrating the operation principle of an extension resonator-type laser diode package according to the present invention.

As illustrated in FIG. 2, a laser diode package according to the present invention includes: a laser diode chip 100 that is mounted on a sub-mount 110 for a laser diode chip; a collimating lens 200 that collimates a laser light from the laser diode chip 100 into collimated light; a tunable-selective filter 300 that selectively transmits light having a specific wavelength, which is variable in accordance with temperature, in the laser light collimated through the collimating lens 200; and an optical feedback-partial reflective mirror 500 that reflects some of the laser light traveling through the tunable-selective filter 300 and transmits the other laser light. The laser diode chip 100 and the tunable-selective filter 300 are disposed on a thermoelectric element (not illustrated) for adjusting temperature.

The laser diode chip 100 is an edge emitting type laser diode chip and laser light is emitted from both cut side of the edge emitting type laser diode chip 100. The laser diode chip 100 includes a semiconductor laser of an InP substrate and may emit light having an oscillation wavelength of 1100 nm to 1700 nm, In the cut sides, the cut side of the laser diode chip 100 which faces the optical feedback-partial reflective mirror 500 is a non-reflective coating side (non-reflective side) having reflectivity of 1% or less. The non-reflective side has reflectivity of 1% or less, preferably, 0.1% or less, and more preferably, 0.01% or less. The side opposite to the non-reflective side of the laser diode chip 100 generally has reflectivity of 1% or more, preferably reflective of 10% or more, and more preferably, reflectivity of 80% or more. Light cannot be fed back in the laser diode chip 100 with one of the cut sides non-reflectively coated, so a Fabry-Perot mode in which the laser diode chip 100 functions as a resonator is not formed. Light emitted from the laser diode chip 100 has wavelengths in a very wide wavelength band (generally, half-value breadth of 20 nm or more). The light having a wide wavelength band emitted through the non-reflective side of the laser diode chip 100 is collimated into collimated light by the collimating lens 200. The light having a wide wavelength band that is collimated by the collimating lens 200 travels into the tunable-selective filter 300 having a narrow transmission wavelength bandwidth. In the light traveling into the tunable-selective filter 300, the other except the light passing through the tunable-selective filter 300 is reflected by the tunable-selective filter 300 to another path through which it cannot be fed back to the laser diode chip 100. The light passing through the collimating lens 200 and then the tunable-selective filter 300 from the laser diode chip 100 reaches the optical feedback-partial reflective mirror 500. In the light reaching the optical feedback-partial reflective mirror 500, the light reflecting from the optical feedback-partial reflective mirror 500 is fed back to the laser diode chip 100 through the tunable-selective filter 300 and then the collimating lens 200. Accordingly, an extension resonator-type laser including the laser diode chip 100, the collimating lens 200, the tunable-selective filter 300, and the optical feedback-partial reflective mirror 500 is achieved.

When the transmission bandwidth of the tunable-selective filter 300 is too narrow, a loss of insertion of the light passing through the tunable-selective filter 300 increases, and when the transmission bandwidth of the tunable-selective filter 300 is too wide, it is difficult to effectively select one Fabry-Perot mode. Accordingly, it is preferable to appropriately set the transmission bandwidth of the tunable-selective filter 300 in order to reduce a loss of insertion of light and effectively select the Fabry-Perot mode, and in an embodiment of the present invention, the transmission bandwidth of the tunable-selective filter 300 is set to about 0.25 nm to 3 nm.

Similarly, when the reflectivity of the optical feedback-partial reflective mirror 500 is too low, the amount of light fed back to the laser diode chip 100 for wavelength locking is too small, so wavelength locking of a laser is not generated, easily, and when the reflectivity of the optical feedback-partial reflective mirror 500 is too high, a signal that passes through the optical feedback-partial reflective mirror 500 to be used for light transmission becomes too weak. Accordingly, it is preferable to appropriately set the reflectivity of the optical feedback-partial reflective mirror 500, and in an embodiment of the present invention, the reflectivity of the optical feedback-partial reflective mirror 500 is set to about 20% to 80%.

Figure 3:
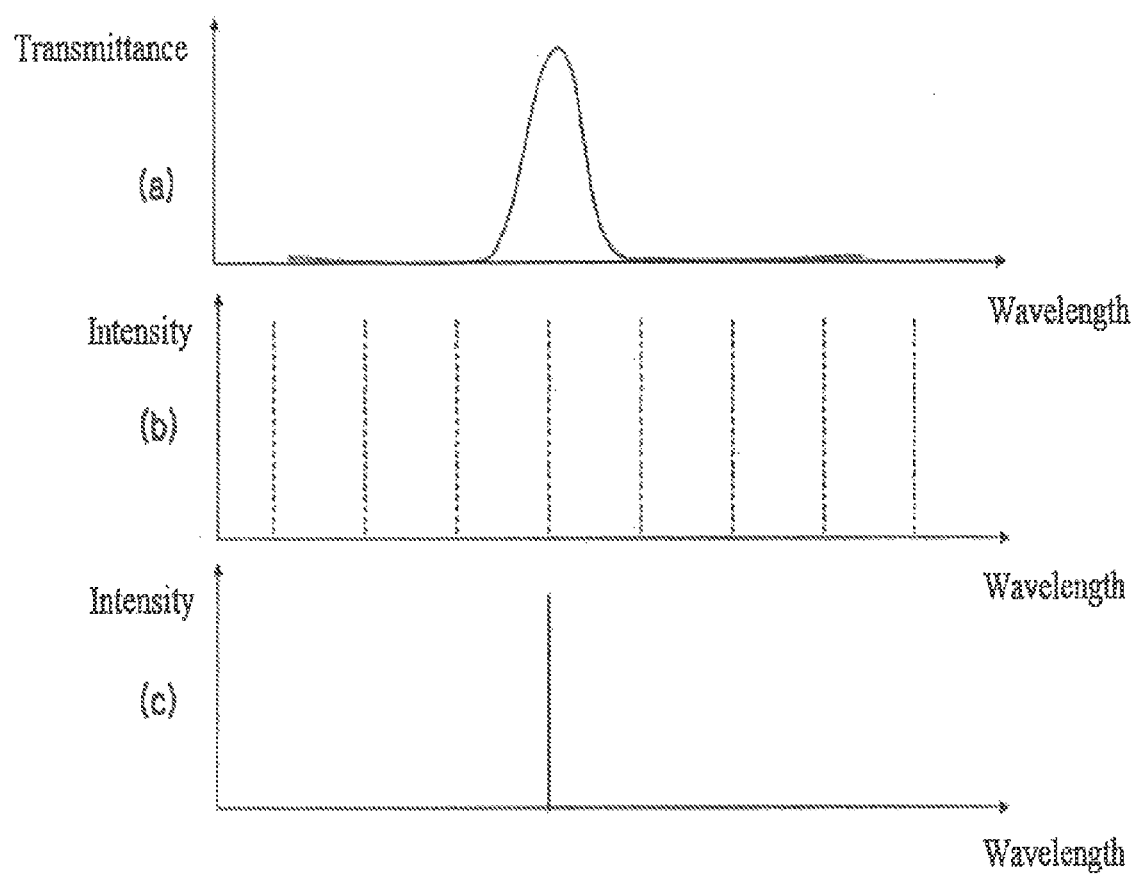
FIG. 3 is a conceptual diagram illustrating oscillation wavelength determination in an extension resonator-type laser, in which (a) of FIG. 3 is an example of a transmission curve of a tunable-selective filter, (b) of FIG. 3 is an example of a Fabry-Perot mode determined in an extension resonator, and (c) of FIG. 3 is an example of a wavelength characteristic of laser light oscillated by an extension resonator and a tunable-selective filter.

FIG. 3 is a conceptual diagram illustrating oscillation wavelength determination from an extension resonator-type laser, in which (a) of FIG. 3 exhibits an example of a transmission curve of a wavelength-selectable filter, (b) of FIG. 3 exhibits an example of a Fabry-Perot mode determined in an extension resonator, and (c) of FIG. 3 exhibits an example of a wavelength characteristic of laser light oscillated by an extension resonator and a tunable-selectable filter. The wavelength determined in the extension resonator-type laser is determined on the basis of two factors of the transmission band of the tunable-selective filter having one transmission wavelength band in a concerned wavelength band, as in (a) of FIG. 3, and of a periodic and discontinuous Fabry-Perot mode determined by the length of the extension resonator, as in (b) of FIG. 3, and the determined specific wavelength is oscillated, as in (c) of FIG. 3.

(b) of FIG. 3 means an available oscillation wavelength band of a laser in the resonator structure of FIG. 2 and the wavelength oscillated in the resonator structure is oscillated one or more of the Fabry-Perot available wavelength bands illustrated in (b) of FIG. 3. In the resonator structure of FIG. 2, only a mod in the transmission band of the tunable-selective filter of (a) of FIG. 3 in a discontinuous Fabry-Perot available mode in which a laser can be oscillated by the extension resonator of (b) of FIG. 3 resonates the extension resonator and oscillates a laser, so that laser light having a specific wavelength is generated, as in (c) of FIG. 3.

Figure 4:
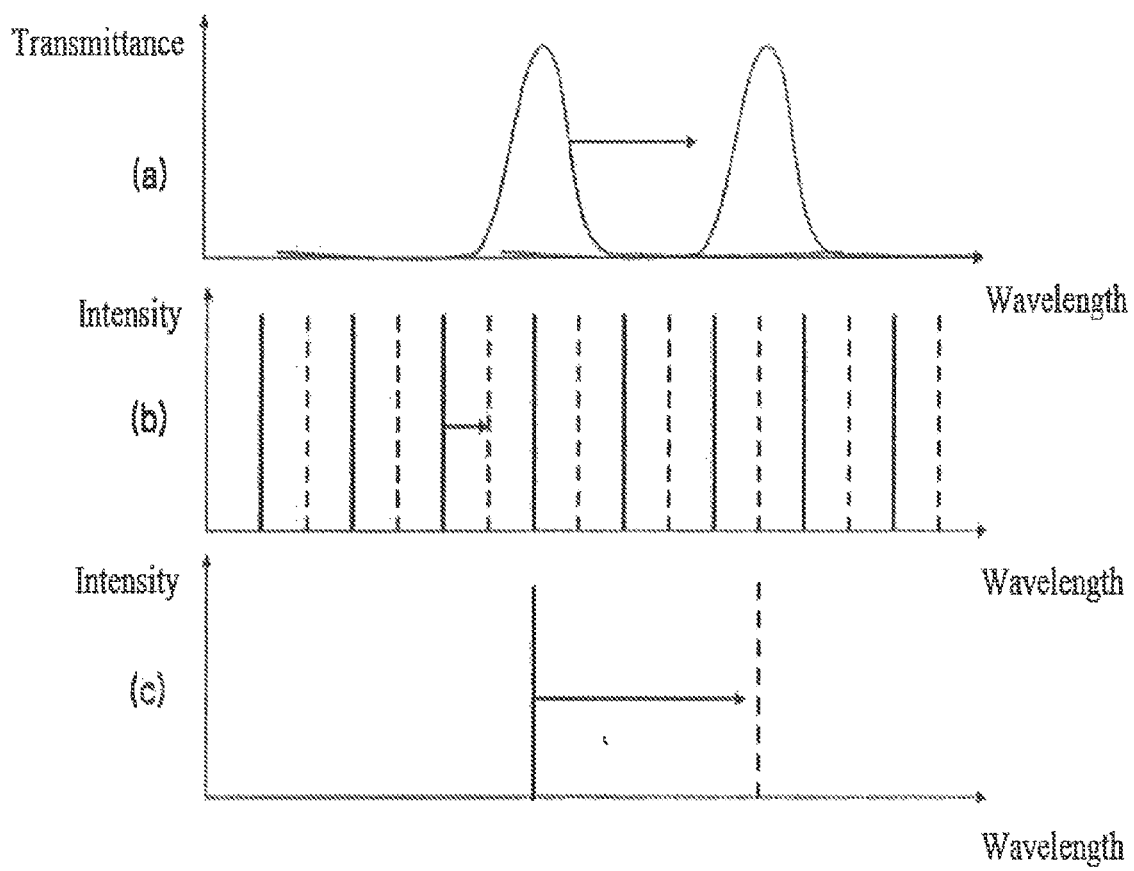
FIG. 4 is a conceptual diagram illustrating oscillation wavelength determination in an extension resonator-type tunable laser, in which (a) of FIG. 4 is an example of a curve illustrating a change in transmittance of a tunable-selective filter according to temperature, (b) of FIG. 4 is an example illustrating a change in a Fabry-Perot mode determined in an extension resonator according to temperature, and (c) of FIG. 4 is an example illustrating a Fabry-Perot mode of an extension resonator that changes in accordance with temperature and a change characteristic of the wavelength of laser light oscillated by a tunable-selective filter that changes in accordance with temperature.

Meanwhile, when the temperature of the thermoelectric element not illustrated in FIG. 2 is changed, the temperature of the semiconductor laser diode chip 100 and the tunable-selective filter 300 on the thermoelectric element is changed. The semiconductor laser diode chip 100 manufactured on the basis of an InP substrate and the tunable-selective filter 300 manufactured on the basis of a GaAs substrate have a change in reflectivity of about 2×10−4. FIG. 4 is a conceptual diagram illustrating oscillation wavelength determination in an extension resonator-type tunable laser, in which (a) of FIG. 4 is an example of a curve illustrating a change in transmittance of a wavelength-selectable filter according to temperature, (b) of FIG. 4 is an example illustrating a change in a Fabry-Perot mode determined in an extension resonator according to temperature, and (c) of FIG. 4 is an example illustrating a Fabry-Perot mode of an extension resonator that changes in accordance with temperature and a change characteristic of the wavelength of laser light by a wavelength-selectable filter that changes in accordance with temperature. With the change in temperature of the thermoelectric element, as illustrated in (a) of FIG. 4, the transmission band of the tunable-selective filter 300 moves about 90 pm/° C., The laser diode chip 100 and the tunable-selective filter 300 that are the components of the resonator change in reflectivity, so the Fabry-Perot mode of the entire resonator also changes, as in (d) of FIG. 4. Accordingly, a Fabry-Perot mode in which the actual oscillation wavelength is within the transmission band of the tunable-selective filter 300 in convertible Fabry-Perot modes, as in (c) of FIG. 4, is oscillated, so the wavelength of the laser light emitted from the laser resonator is changed.

In general, in a TO type package that is mounted on an SFP transceiver, all the parts should be mounted inside the cap and light coming out of the TO type package should emitted around the center of the TO type package. Accordingly, there is a need for a 45°-reflective mirror that changes horizontal laser light into vertical laser light to discharge laser light horizontally traveling out of the TO package cap above it and such a 45°-reflective mirror should be disposed right under the cap of the TO type package.

Figure 5:
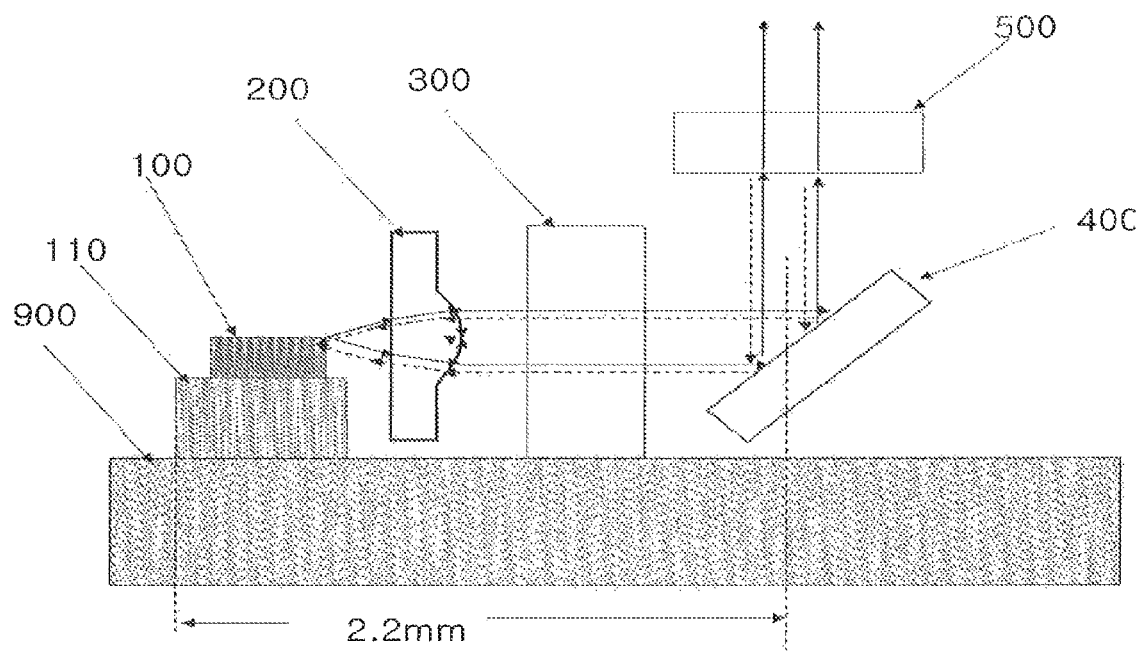
FIG. 5 is conceptual diagram illustrating installation of a laser device having a folder type resonator structure according to the present invention.

FIG. 5 is conceptual diagram illustrating installation of a laser device having a folder type resonator structure according to the present invention, in which a 45°-reflective mirror 400 that changes the direction of laser light to be vertical is disposed at a side of the optical feedback-partial reflective mirror 500.

In general, the inner diameter of the cap of a TO type package that is mounted on an SFP transceiver is about 4.4 mm at the maximum and the length between the laser diode chip 100 and the center of the 45°-reflective mirror 400 should be within 2.2 mm physically so that light comes out from the center of the cap of the TO type package.

The laser diode chip 100 of the external resonator-type laser is about 400 nm at the minimum and the length of a sub-mount 110 of the diode chip 100 is about 700 nm, considering heat dissipation of the laser diode chip 100. The collimating lens 200 providing an appropriate beam size is about 400 nm thick and the tunable-selective filter 300 is about 500 nm thick at the minimum, considering stress due to a dielectric thin layer deposited on the tunable-selective filter 300. The thickness of the optical feedback-partial reflective mirror 500 is generally 300 nm to 500 nm and the size of the 45°-reflective mirror 400 is about 1000 nm. A space of at least about 150 nm is required between the parts to arrange the parts. Accordingly, as in FIG. 2, when the parts are all disposed in a line above the thermoelectric element 900 of the TO type package, the distance from the laser diode chip 100 to the center point of the 45°-reflective mirror 400 increases to about 2.7 mm, considering the space required between the parts, so light cannot come out from the center portion of the TO type package.

Further, assuming that the reflectivity of the laser diode chip 100 is about 3.5 and the reflectivity of the collimating lens 200 made of glass, the tunable-selective filter 300, and the optical feedback-partial reflective mirror 500 is 1.5, the effect optical resonator length (reflectivity converted into 1) of the extension resonator including the laser diode chip 100 and the optical feedback-partial reflective mirror 500 is about 4 mm. When the optical resonator length is 4 mm, the gap between the resonator Fabry-Perot modes of (b) of FIG. 3 is about 300 pm. When the laser unstably operates and an oscillation wavelength hops to an adjacent Fabry-Perot mode, it is called mode hopping. It is recommended for DWDM that the wavelength, including mode hopping, is within +/−100 pm from the wavelength determined by an international organization. Accordingly, in order to maintain a wavelength within 100 pm from a predetermined wavelength, even in mode hopping, it is preferable to increase the length of the optical effect resonator of the extension resonator to at least 6 mm or more. However, as in the structure of FIG. 2, when a resonator has a one-dimensional arrangement, an increase in the optical effect resonator of the extension resonator necessarily increases the horizontal length of the resonator, so the point where laser light comes out of the TO package moves further from the center of the TO package.

In order to solve the problems, a folder type extension resonator-type laser structure is introduced in the present invention, as in FIG. 5. When a resonator is arranged, as in FIG. 5, there is no direct relationship between the length of the resonator and the point where laser light comes out of a TO package, there is an advantage that it is possible to manufacture an extension resonator type laser having a long resonator structure, using a TO can package having a narrow area. In the structure of FIG. 5, the tunable-selective filter 300 is attached directly to the thermoelectric element 900.

Figure 6:
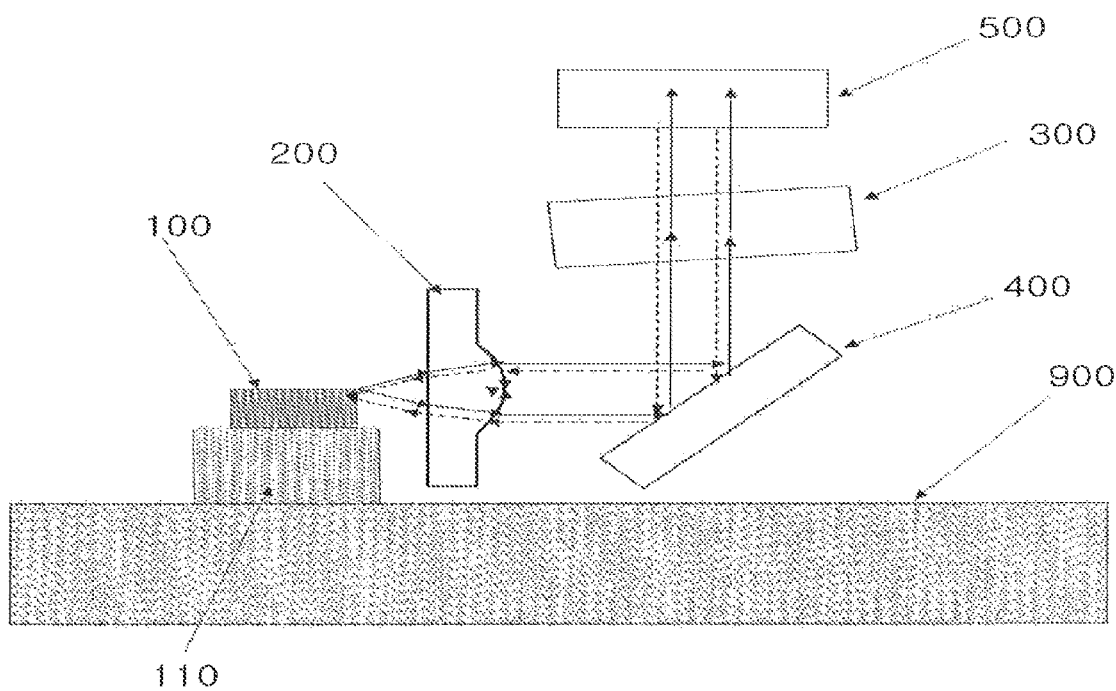
FIG. 6 is conceptual diagram illustrating installation of a laser device having another folder type resonator structure according to the present invention.

FIG. 6 is a conceptual diagram illustrating installation of a laser device according to another embodiment of the present invention, in which the tunable-selective filter 300 and the optical feedback-partial reflective mirror 500 are disposed over the 45°-reflective mirror 400. In this arrangement, the horizontal length of the resonator can be within 1.5 mm and the optical length of the resonator can be 6 mm or more.

Figure 7:
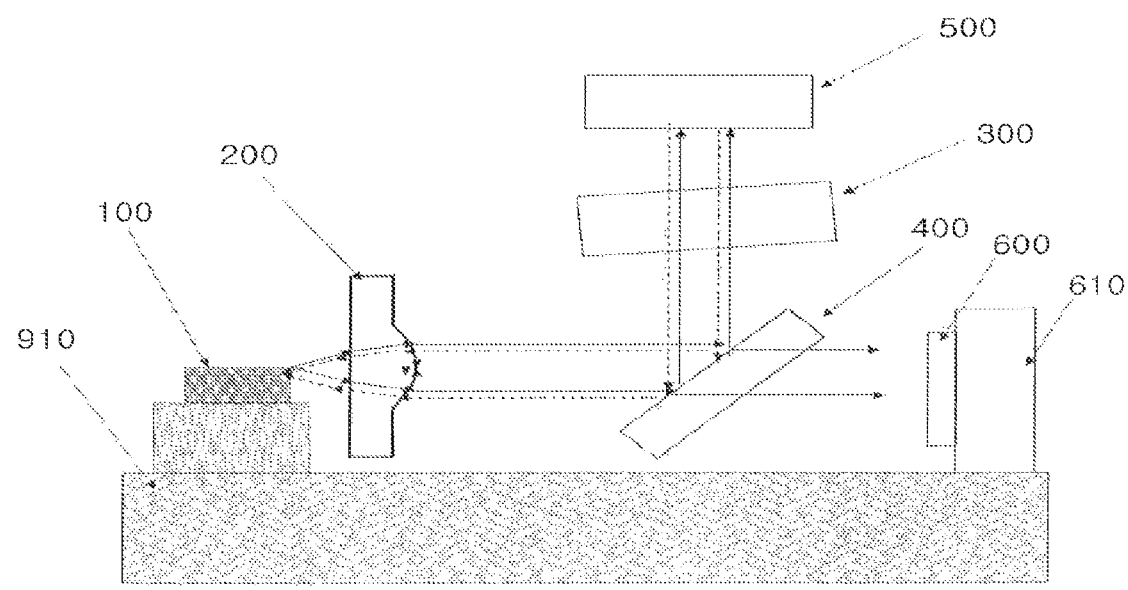
FIG. 7 is conceptual diagram illustrating installation of a laser device with an optical supervisory photodiode according to an embodiment of the present invention.

FIG. 7 is a conceptual diagram illustrating installation of a laser device with an optical supervisory photodiode according to an embodiment of the present invention.

In FIG. 7, the 45°-reflective mirror 400 is a partial reflective mirror and an optical supervisory photodiode 600 attached to a photodiode sub-mount 610 is disposed behind the 45°-reflective mirror 400 so that it is possible to monitor the intensity of laser light by sending a portion of light, which travels into the 45°-reflective mirror 400, into the optical supervisory photodiode 600 through the 45°-reflective mirror 400. In this arrangement, the optic intensity supervisory photodiode 600 is disposed opposite to the laser resonator with the center point of the TO package therebetween, so it is possible to efficiently use the inside of the TO type package.

Figure 8:
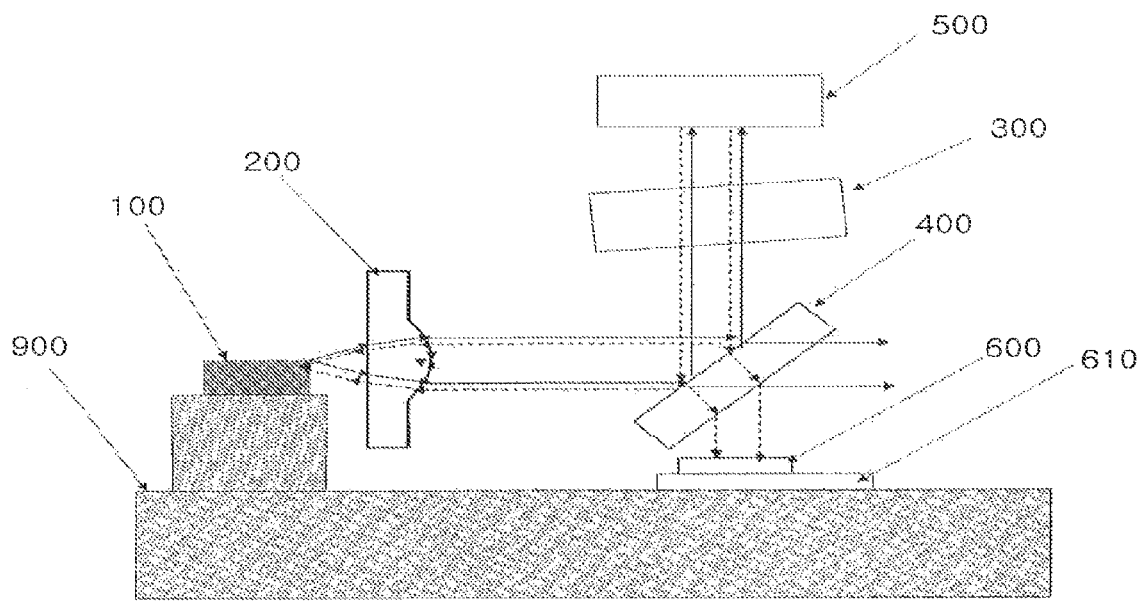
FIG. 8 is conceptual diagram illustrating another installation of the laser device with an optical supervisory photodiode according to an embodiment of the present invention.

It is possible to monitor the intensity of light by sending a portion of light, which is emitted from the laser diode chip 100 and travels into the 45°-reflective mirror 400, into the optical supervisory photodiode 600, as in FIG. 7, but the optical supervisory photodiode 600 may be disposed under the 45°-reflective mirror 400 to monitor the intensity of light, and FIG. 8 is a conceptual diagram illustrating installation of an optical supervisory photodiode disposed under a 45°-reflective mirror. When the 45°-reflective mirror 400 has the function of a partial reflective mirror, light passes through the 45°-reflective mirror 400, even if the light, which is in the path returning to the laser diode chip 100 after reflecting from the optical feedback-partial reflective mirror 500, in the light reflecting from the 45°-reflective mirror 400 and then traveling into the optical feedback-partial reflective mirror 500, reaches the 45°-reflective mirror 400.

The light travels to the 45°-reflective mirror 400 from the optical feedback-partial reflective mirror 500 and passes through the 45°-reflective mirror 400 reaches the bottom of the 45°-reflective mirror 400, so it is possible to perform the function of monitoring the intensity of light in the same way, even if the optical supervisory photodiode 600 is disposed under the 45°-reflective mirror 400. Arranging the optical supervisory photodiode 600 under the 45°-reflective mirror 400 does not increase the horizontal axial length of the extension resonator, so it is also a method capable of maximally using the inside area of the TO type package.

Figure 9:
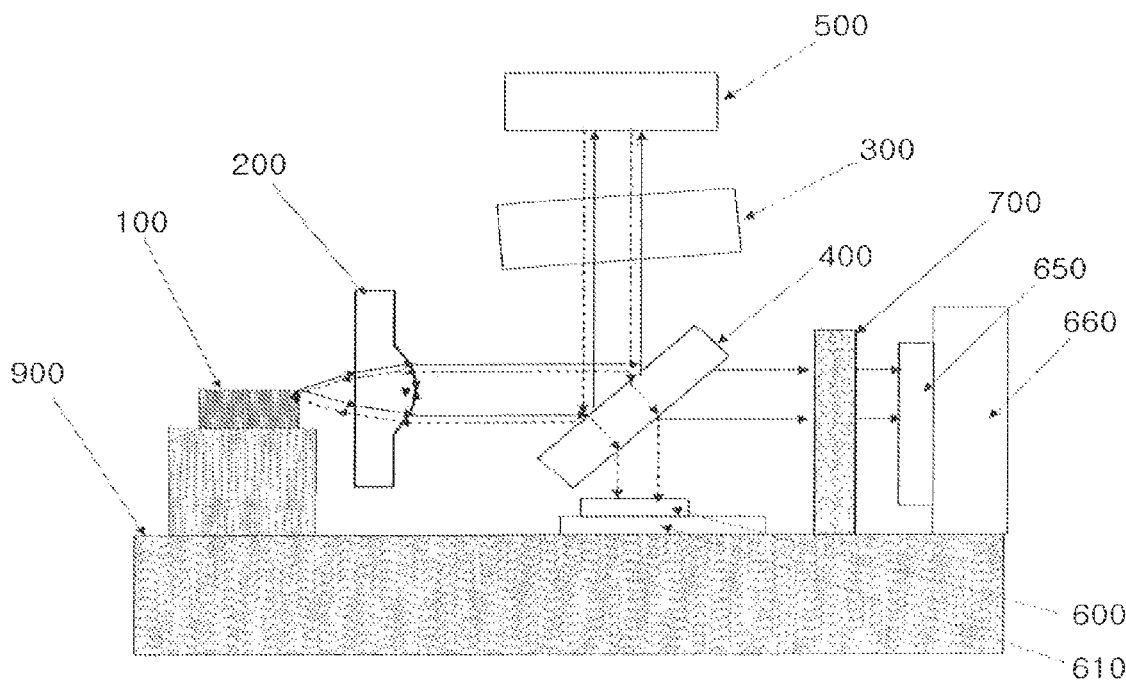
FIG. 9 is a conceptual diagram illustrating installation of a laser device having an optical supervisory device and an external resonator structure mountable on a TO type package, according to another embodiment of the present invention.

FIG. 9 is a conceptual diagram illustrating a laser device according to another embodiment of the present invention, which relates to a method of finding the wavelength of light, using light vertically and horizontally passing through the 45°-reflective mirror 400.

As illustrated in FIG. 9, a wavelength filter 700 of which the transmittance changes in accordance with a wavelength is inserted in the path of light vertically passing through the 45°-reflective mirror 400 and a wavelength supervisory photodiode 650 is attached to a path of light passing through the wavelength filter 700. Further, an output supervisory photodiode 620 is disposed in the path of light vertically passing through the 45°-reflective mirror 400. It is possible to find the ratio of light passing through the wavelength filter 70 by dividing the optical current of the wavelength supervisory photodiode 650 disposed as described above by the optical current flowing through the output supervisory photodiode 620, and it is possible to find the wavelength of laser light from the ratio. For the characteristics of the wavelength filter 700, it is preferable that the wavelength characteristic does not change or changes in accordance with temperature within 15 pm/° C. and more preferably, the wavelength characteristic changes in accordance with temperature within 3 pm/° C.

Figure 10:
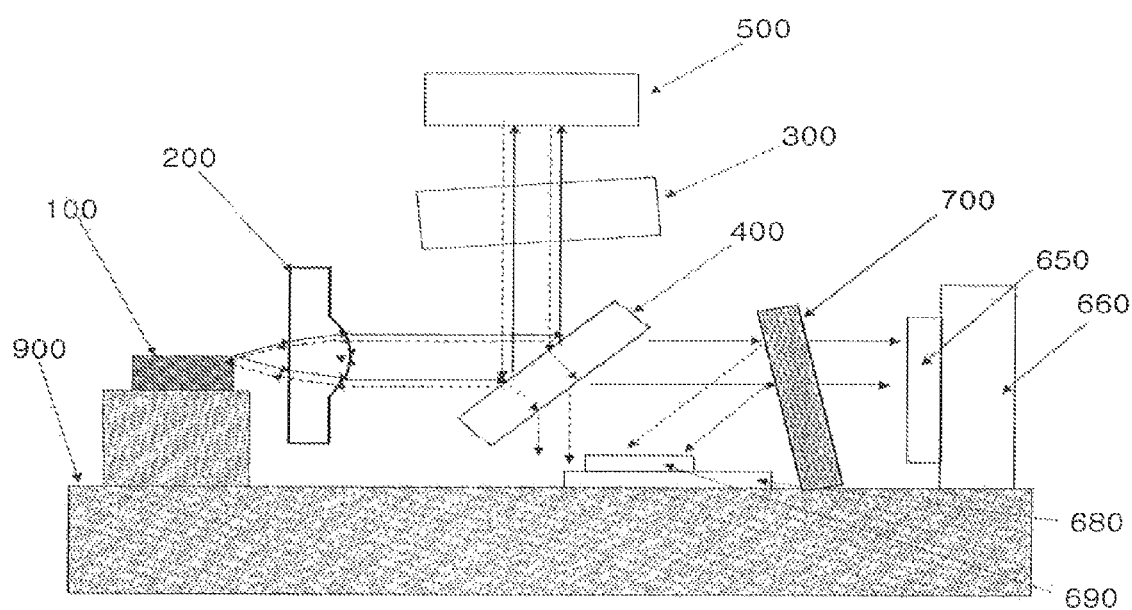
FIG. 10 is a conceptual diagram illustrating installation of a laser device having an optical supervisory device and an external resonator structure mountable on a TO type package, according to another embodiment of the present invention.

FIG. 10 is a conceptual diagram illustrating a laser device according to another embodiment of the present invention, in which a wavelength filter 700 of which the transmittance changes in accordance with a wavelength is inserted in the path of light vertically passing through the 45°-reflective mirror 400 and a wavelength supervisory photodiode 650 is attached to a path of light passing through the wavelength filter 700. An output supervisory photodiode 620 is disposed in the path of light reflecting from the wavelength filter 700. It is possible to find the intensity of light passing through the wavelength filter 70 and the ratio of reflecting light by comparing the optical current of the wavelength supervisory photodiode 650 disposed as described above with the optical current flowing through the output supervisory photodiode 620, and it is possible to find the wavelength of laser light from the ratio.

Figure 11:
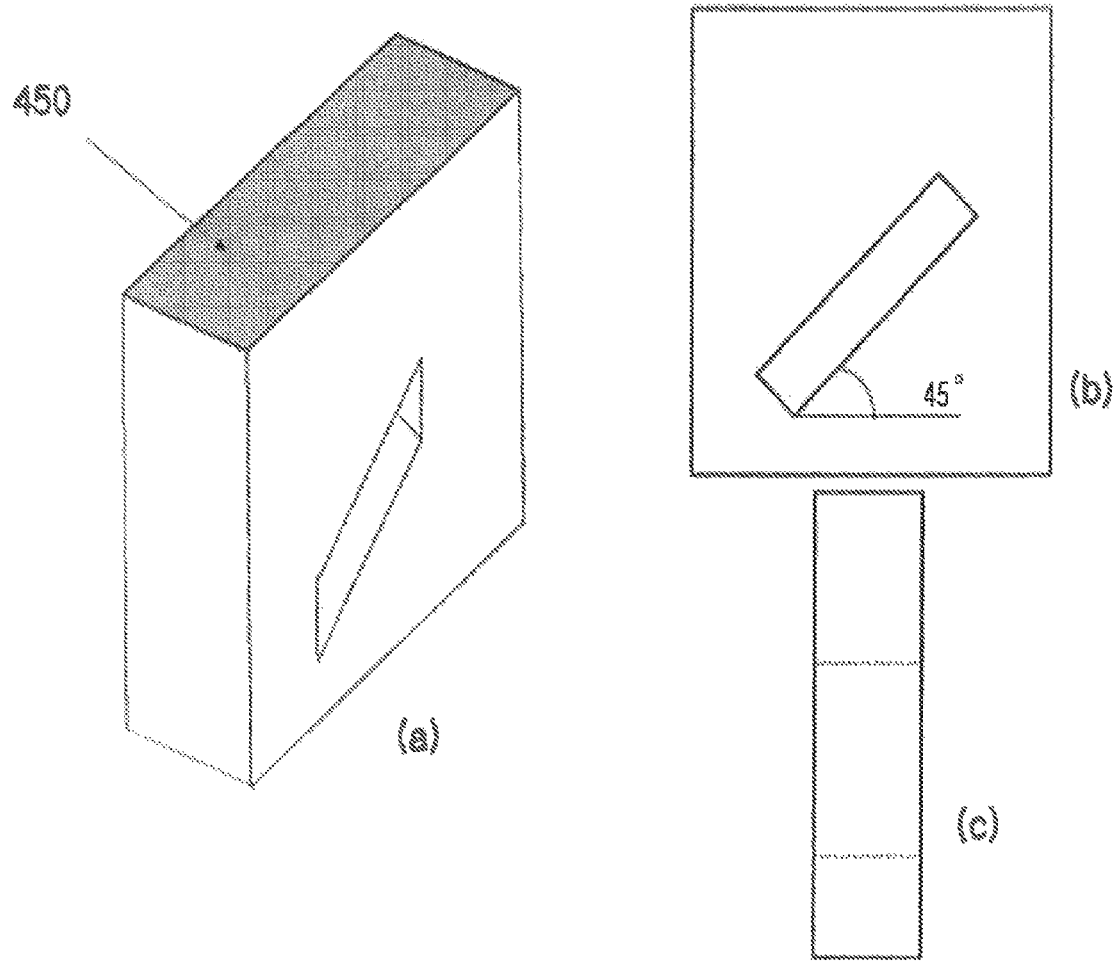
FIG. 11 is a conceptual diagram illustrating installation of a stand making it easy to fix a 45°-reflective mirror according to an embodiment of the present invention.

FIG. 11 is a diagram illustrating a 45°-reflective mirror stand for easily mounting a 45°-reflective mirror on a TO type package according to an embodiment of the present invention.

As illustrated in FIG. 11, the 45°-reflective mirror stand 450 according to the present invention is manufactured in a hexahedral shape with a through-through-hole at 45° with respect to the bottom and a flat plate-shaped 45°-reflective mirror 400 is inserted in the through-hole and disposed on a thermoelectric element. A partial reflective mirror 500 is attached to the upper portion of the 45°-reflective mirror stand 450. This structure makes it possible to easily attach the 45°-reflective mirror 400 and the partial reflective mirror 500. A material having a high heat transfer rate is suitable for the stand 450 and a silicon substrate that has a heat transfer rate of 170 W/m and allows easy forming of a hold through dry etching is suitable for the material. In particular, it is very easy to adjust the width of a through-hole through dry etching and easy to adjust the angle with respect to the bottom, so the flat plate-shaped reflective mirror 400 can be arranged at 45° by only inserting the flat plate-shaped reflective mirror 400 in the through-hole of the silicon stand, thereby making an assembly process easy.

On the other hand, when the external environment temperature around a TO type package, heat transfers between the outer side of the TO type package and the parts in the TO type package. The distances between the parts in the TO type package and the outer side of the TO type package can be variously changed, so a change in external environment temperature around the TO type package may non-uniformly change the temperature of the parts in the TO type package. The individual change in temperature of the material of the resonator non-uniformly changes the effective optical length of the resonator, so it is preferable to minimize heat transfer between the parts of the resonator and the TO type package. Accordingly, it is preferable to keep the inside of the TO type package vacuum and the degree of vacuum is preferably 0.2 atmospheric pressure or less.

As described above, in the laser diode package device according to the present invention, since the optical feedback-partial reflective mirror 500 is disposed over the 45°-reflective mirror 500 disposed horizontally to the laser diode chip, the horizontal length of the laser resonator is minimized and the optical resonator length is increased, so it is possible to maximally use the inside area of the TO type package. The present invention is not limited to the embodiments described above and it should be understood that the present invention may be changed and modified in various ways by those skilled in the art within a range equivalent to the spirit of the present invention and claims to be described below.

DESCRIPTION OF MAIN REFERENCE NUMERALS OF DRAWINGS

100: Laser diode chip
110: Laser diode chip sub-mount
200: Collimating lens
300: Tunable-selective filter -continued 400: 45°-reflective mirror
450: Stand
500: Optical feedback-partial reflective mirror
600: Photodiode
610: Photodiode sub-mount
620: Output supervisory photodiode
650: Wavelength supervisory photodiode
660: Wavelength supervisory photodiode sub-mount
700: Wavelength filter having transmittance changing in accordance with wavelength
900: Thermoelectric element
910: Package stem

The invention claimed is:

1. A semiconductor laser device comprising:
a laser diode chip (100) that emits laser light;
a 45°-reflective mirror (400) that changes laser light traveling horizontally to a package bottom into laser light traveling perpendicular to the package bottom and is a partial reflective mirror having a partial reflection/partial transmission characteristic;
a collimating lens (200) being disposed along a path of light between the laser diode chip (100) and the 45°-reflective mirror (400), and the collimating lens (200) collimating light emitted from the laser diode chip (100);
a tunable-selective filter (300) for changing a transmissive wavelength in accordance with temperature, and the tunable-selective filter (300) being disposed along a path of light reflected vertically by the 45°-reflective mirror (400);
an optical feedback-partial reflective mirror (500) being disposed along a path of light reflected by the 45°-reflective mirror (400) and passing through the tunable-selective filter (300), and the optical feedback-partial reflective mirror (500) reflecting some of the laser light passing through the tunable-selective filter (300) back through the tunable-selective filter (300) and toward the 45° -reflective mirror (400) while transmitting a remainder of the laser light which passes through the tunable-selective filter (300);
an optical supervisory photodiode (600) being disposed under the 45°-reflective mirror (400) and along a path of light passing vertically through the 45°-reflective mirror (400), and the optical supervisory photodiode (600) receiving a fed laser light reflected from the optical feedback-partial reflective mirror (500) and passing through the 45°-reflective mirror (400) for monitoring an intensity of the fed laser light;
a wavelength supervisory photodiode (650) being disposed on a side of the 45°-reflective mirror (400) and along a light path passing horizontally through the 45°-reflective mirror (400), and the optical supervisory photodiode (650) receiving laser light emitted from the laser diode chip (100) which passes through the 45°-reflective mirror (400) and monitoring the intensity of the laser light emitted from the laser diode chip (100); and
a wavelength filter (700) being disposed between the 45°-reflective mirror (400) and the optical supervisory photodiode (650) and along the path of light passing through the 45°-reflective mirror (400), and the wavelength filter (700) changing a transmittance in accordance with wavelength;
wherein the transmittance of the wavelength filter (700) and the wavelength of light are calculated by comparing optical current flowing through the optical supervisory photodiode (600) and the optical supervisory photodiode (650).

2. The laser device of claim 1, wherein the tunable-selective filter (300) is manufactured by alternately depositing GaAs and AlGaAs on a GaAs substrate, and a half-value breadth of a transmissive wavelength band is 0.25 nm to 3 nm.

\* \* \* \* \*